United States Patent
Tseng et al.

(10) Patent No.: US 10,453,594 B1
(45) Date of Patent: Oct. 22, 2019

(54) PTC DEVICE

(71) Applicant: Polytronics Technology Corp., Hsinchu (TW)

(72) Inventors: Chun Teng Tseng, Sanwan Township (TW); David Shau Chew Wang, Taipei (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 16/290,191

(22) Filed: Mar. 1, 2019

(30) Foreign Application Priority Data

Jun. 8, 2018 (TW) .............................. 107119875 A

(51) Int. Cl.
H01C 7/02 (2006.01)
H01C 1/14 (2006.01)
G01K 7/16 (2006.01)
G01R 19/165 (2006.01)
H01C 17/00 (2006.01)

(52) U.S. Cl.
CPC ............... *H01C 7/021* (2013.01); *G01K 7/16* (2013.01); *G01R 19/16571* (2013.01); *H01C 1/1406* (2013.01); *H01C 17/00* (2013.01)

(58) Field of Classification Search
CPC ............................... H01C 7/021; H01C 1/1406
See application file for complete search history.

(56) References Cited

U.S. PATENT DOCUMENTS

| | | | | |
|---|---|---|---|---|
| 5,572,779 A * | 11/1996 | Adelman | ............... | H01F 41/046 257/E23.061 |
| 6,285,275 B1 * | 9/2001 | Chen | ................... | H01C 1/1406 338/22 R |
| 8,896,410 B2 * | 11/2014 | Saito | ................... | H01C 1/1413 338/22 R |
| 2002/0050914 A1 * | 5/2002 | Chiang | ................ | H01C 1/1406 338/22 R |
| 2013/0187748 A1 * | 7/2013 | Sha | ........................ | H01C 1/084 338/22 R |

* cited by examiner

*Primary Examiner* — Kyung S Lee
(74) *Attorney, Agent, or Firm* — Muncy, Geissler, Olds & Lowe, P.C.

(57) ABSTRACT

A PTC device comprises a current and temperature sensing element, a first insulating layer, a second insulating layer, a first electrode layer and a second electrode layer. The current and temperature sensing element is a laminated structure comprising a first electrically conductive layer, a second electrically conductive layer and a PTC material layer. The first and second electrically conductive layers are disposed on first and second surfaces of the PTC material layer. The first and second insulating layers are disposed on the first and second electrically conductive layers. The first electrode layer is disposed on the first insulating layer and electrically connects to the first electrically conductive layer. The second electrode layer is disposed on the second insulating layer and electrically connects to the second electrically conductive layer. The first and second electrode layers serve as solder attach surfaces for soldering the PTC device onto a circuit board.

6 Claims, 5 Drawing Sheets

PTC DEVICE

BACKGROUND OF THE INVENTION

(1) Field of the Invention

The present application relates to a thermistor. More specifically, it relates to a positive coefficient temperature (PTC) device.

(2) Description of the Related Art

A PTC device can be used for circuit protection to avoid over-temperature or over-current which would cause damages. A PTC device usually comprise two electrodes and a resistive material disposed therebetween. The resistive material has PTC feature, i.e., it has an extremely low resistance at a normal temperature; however, when an over-current or an over-temperature occurs in the circuit, the resistance instantaneously increases to extremely high resistance (i.e., trip) to diminish the current for circuit protection. The PTC device can be applied to temperature sensing circuit to sense ambient temperature, so as to determine on whether to take actions for over-temperature protection such as shutdown or power off. When the temperature decreases to room temperature or over-current no longer exists, the over-current protection device returns to low resistance state so that the circuit operates normally again. Because the PTC devices can be reused, they can replace fuses or other temperature sensing devices to be widely applied to high-density circuitries.

With lightweight and compact trends, electronic apparatuses are getting smaller. For a cell phone, a number of components have to be integrated into a limited space, in which an over-current protection device is usually secured to a protective circuit module (PCM) and its external lead will occupy a certain space. Therefore, it is desirable to have a thin-type protection device that does not take up much room. When the device is downsizing to form factor 0201, it is a great challenge on how to decrease the thickness of the protection device for surface-mount applications.

According to specification of 0201, a device has a length of 0.6±0.03 mm, a width of 0.3±0.03 mm and a thickness of 0.25±0.03 mm. In manufacturing, the length and width are doable, but the thickness is too thin to be achieved. Nowadays, the resistive material substrate of carbon black system can be at most pressed to 0.2 mm in thickness, and the resistive material substrate of ceramic filler system can obtain a thickness of 0.2-0.23 mm. If the resistive substrate is further engaged with insulating (prepreg) layers and internal and external circuits (electrodes) to form an over-current protection device as shown in U.S. Pat. No. 6,377,467, not only is the thickness out of specification but also the thickness may be equal to or larger than width. As a result, the devices may topple when they are subjected to packaging or other processes afterwards. Moreover, the internal-and-external circuit design on a small size device sometimes has misalignment between the internal circuit and external circuit, and therefore the production yield will be negatively impacted.

U.S. Pat. No. 9,007,166 proposes a solution to the aforesaid problem. Without prepreg layers and external electrode layers, a PTC composite substrate is devised to etch or cut an electrode layer of the PTC composite substrate to form a groove isolating right and left electrodes, so as to control the thickness of the PTC over-current protection device to be smaller than or equal to 0.28 mm. However, the electrode layers of the PTC device are not symmetrical, and therefore there is a need to verify the orientation of the PTC device under electric testing and packaging. Moreover, the groove may be misaligned due to inflation and retraction of the PTC material during manufacturing, and the right and left electrodes of unequal areas influence electric characteristic. Without support of prepreg layers, the PTC device may flaw due to insufficient strength during manufacturing.

SUMMARY OF THE INVENTION

The present application provides a PTC device characterized in over-current protection and/or over-temperature sensing. In view of simple structure and manufacturing process, the PTC device is suitable to be made in small sizes, e.g., a form factor 0402 or 0201. The PTC device has no internal circuit, and thus there is no concerns of material inflation and retraction and misalignment between internal and external circuits. Moreover, the PTC device still has prepreg supports at two sides, thereby enhancing structural strength and increasing manufacturing yield.

In accordance with an embodiment of the present application, a PTC device comprises a current and temperature sensing element, a first insulating layer, a second insulating layer, a first electrode layer and a second electrode layer. The current and temperature sensing element is a laminated structure of a first electrically conductive layer, a second electrically conductive layer and a PTC material layer. The first electrically conductive layer is disposed on a first surface of the PTC material layer, and the second electrically conductive layer is disposed on a second surface of the PTC material layer. The second surface is opposite to the first surface. The first insulating layer is disposed on the first electrically conductive layer, and the second insulating layer is disposed on the second electrically conductive layer. The first electrode layer is disposed on the first insulating layer and electrically connects to the first electrically conductive layer. The second electrode layer is disposed on the second insulating layer and electrically connects to the second electrically conductive layer. The first and second electrode layers serve as solder attach surfaces for soldering the PTC device onto a circuit board.

In an embodiment, the first electrode layer, the first insulating layer, the first electrically conductive layer, the PTC material layer, the second electrically conductive layer, the second insulating layer and the second electrode layer are laminated in order.

In an embodiment, the first electrode layer, the first insulating layer, the first electrically conductive layer, the PTC material layer, the second electrically conductive layer, the second insulating layer and the second electrode layer form a bottom surface facing the circuit board as an interface for soldering onto the circuit board.

In an embodiment, the PTC device further comprises a first electrically conductive hole and a second electrically conductive hole. The first electrically conductive hole penetrates through the first insulating layer, and connects to the first electrode layer and the first electrically conductive layer. The second electrically conductive hole penetrates through the second insulating layer, and connects to the second electrode layer and the second electrically conductive layer.

In an embodiment, the first electrically conductive hole is located at a center, side or corner of the first insulating layer, and the second electrically conductive hole is located at a center, lateral side or corner of the second insulating layer.

In an embodiment, the first insulating layer, the first electrically conductive layer, the PTC material layer, the second electrically conductive layer and the second insulating layer form a bottom surface facing the circuit board. The first electrode layer retracts at edges relative to the first insulating layer to form notches, and the second electrode layer retracts at edges relative to the second insulating layer to form notches.

In an embodiment, the first electrode layer comprises a bulge extending to an edge of the first insulating layer, and the second electrode layer comprises another bulge extending to an edge of the second insulating layer.

In accordance with the present application, the PTC device has no complex internal circuit and therefore there is no concerns of inflation and retraction and misalignment between internal and external circuits. The PTC device can be simply made by pressing and is suitable to be made in small sizes such as 0402 or 0201. The PTC device may have equal width and thickness to avoid rollover issues.

BRIEF DESCRIPTION OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
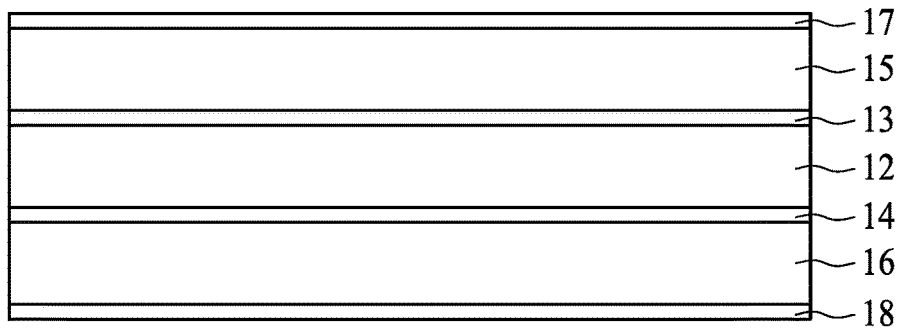
FIGS. 1 through 4 show a manufacturing process of a PTC device in accordance with an embodiment of the present application.

Referring to FIG. 1, a first electrode layer 17, a first insulating layer 15, a first electrically conductive layer 13, a PTC material layer 12, a second electrically conductive layer 14, a second insulating layer 16 and a second electrode layer 18 are pressed to form a laminated structure. The first electrically conductive layer 13 is disposed on a first surface of a PTC material layer 12, and the second electrically conductive layer 14 is disposed on a second surface of the PTC material layer 12. The second surface is opposite to the first surface. The first insulating layer 15 is disposed on the first electrically conductive layer 13, and the second insulating layer 16 is disposed on the second electrically conductive layer 14. The first electrode layer 17 is disposed on the first insulating layer 15, and the second electrode layer 18 is disposed on the second insulating layer 16. The first and second electrically conductive layers 13 and 14 may be copper layers. The first and second insulating layers 15 and 16 may comprise prepreg. The first and second electrode layers 17 and 18 may comprise copper. The PTC material layer 12 comprises crystalline polymer and conductive filler dispersed therein. The crystalline polymer comprises polyethylene, polypropylene, polyvinyl fluoride, mixture or copolymer thereof. The conductive filler may comprise carbon-containing filler, metal filler, and/or ceramic filler. For example, the metal filler may be nickel, cobalt, copper, iron, tin, lead, silver, gold, platinum, or the alloy thereof The ceramic filler may be titanium carbide (TiC), tungsten carbide (WC), vanadium carbide (VC), zirconium carbide (ZrC), niobium carbide (NbC), tantalum carbide (TaC), molybdenum carbide (MoC), hafnium carbide (HfC), titanium boride (TiB$_2$), vanadium boride (VB$_2$), zirconium boride (ZrB$_2$), niobium boride (NbB$_2$), molybdenum boride (MoB$_2$), hafnium boride (HfB$_2$), or zirconium nitride (ZrN). Moreover, the conductive filler may be the mixture, alloy, solid solution or core-shell of the aforesaid metal and ceramic fillers.

Figure 2:
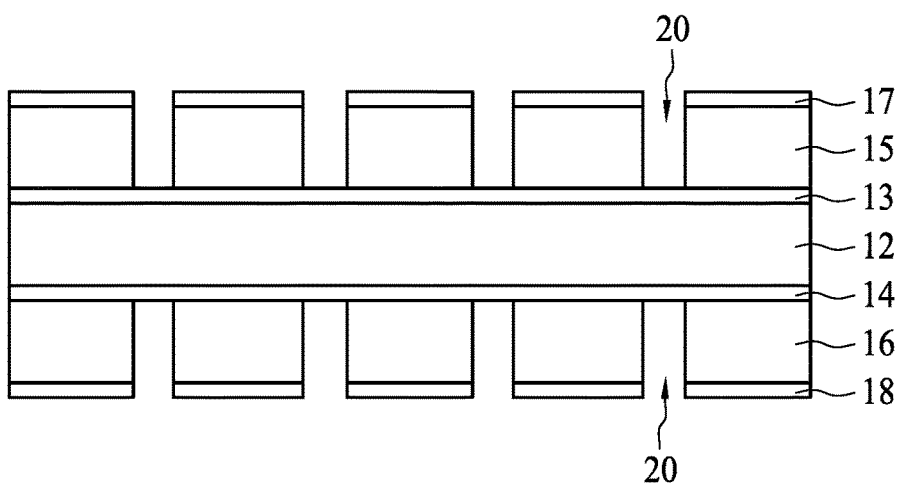
Figure 3:
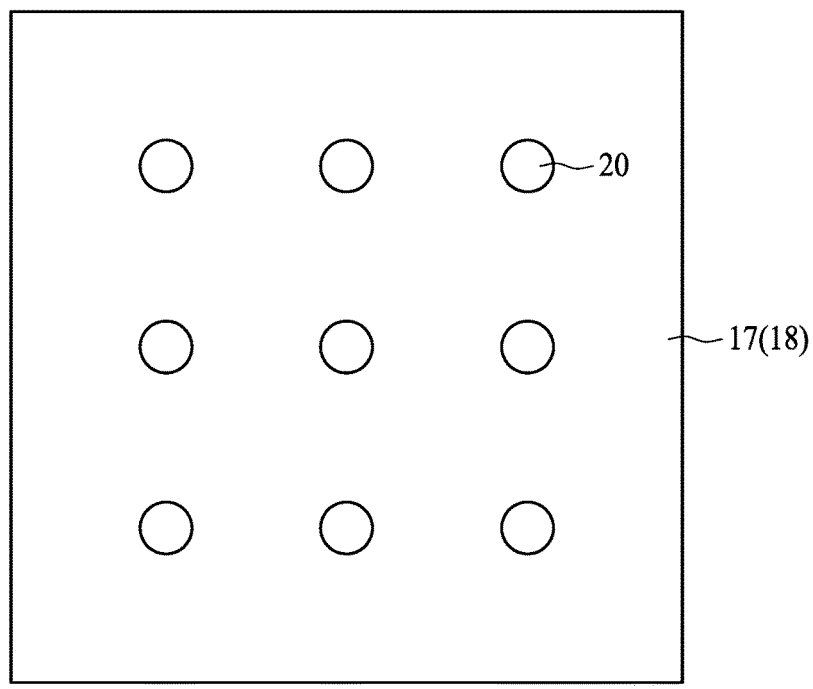

Referring to FIGS. 2 and 3, FIG. 2 is a side view of the laminated structure and FIG. 3 is a top view thereof. Holes 20 with certain intervals are made in the laminated structure at both sides. Upper holes 20 go through the first electrode layer 17 and the first insulating layer 15 and stop at the first electrically conductive layer 13. Lower holes 20 go through the second electrode layer 18 and the second insulating layer 16 and stop at the second electrically conductive layer 14. The holes 20 may be directly made by laser drilling, which is suitable for small size holes and can control the drilling depth precisely. Alternatively, the first electrode layer 17 and the second electrode layer 18 can be etched first and followed by laser drilling the first insulating layer 15 and the second insulating layer 16. The holes 20 may be made by mechanical drilling. However, the first electrically conductive layer 13 and the second electrically conductive layer 14 may be partially and fully removed by mechanical drilling.

Figure 4:
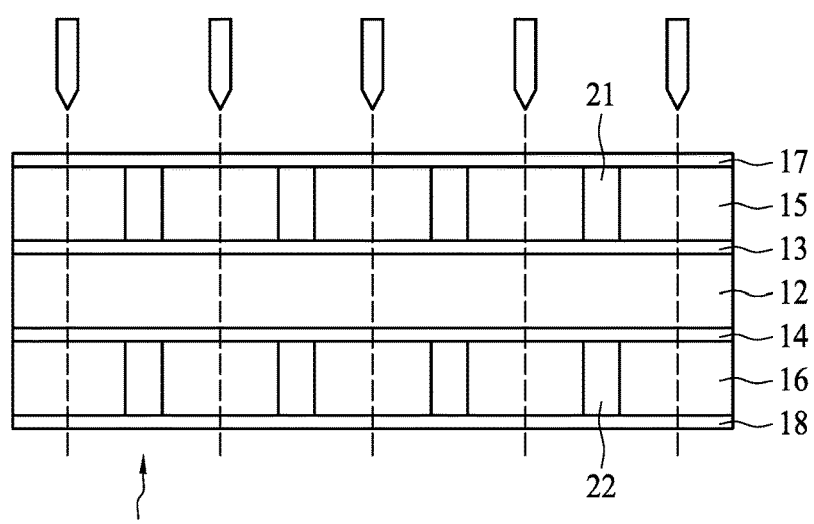
Figure 5:
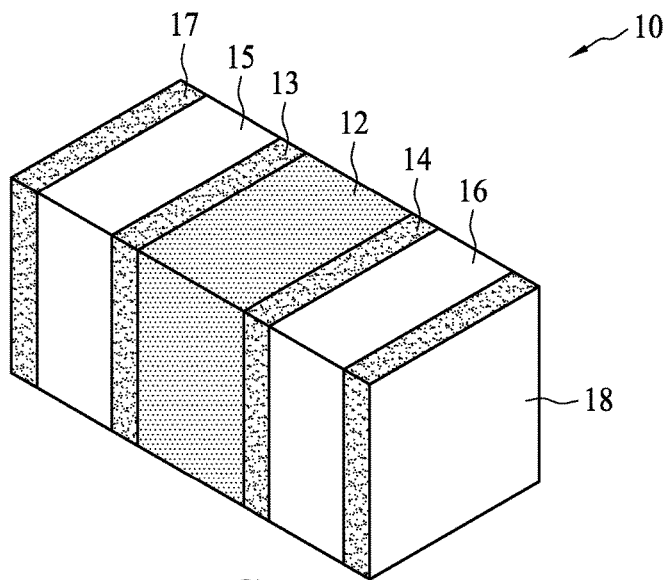
FIG. 5 shows a PTC device in accordance with an embodiment of the present application.

Referring to FIG. 4, the upper and lower holes 20 are filled with electrically conductive material to form first electrically conductive members 21 and second electrically conductive members 22. In an embodiment, the first and second electrically conductive members 21 and 22 may be made by electroplating copper. At the same time, copper may be electroplated onto the first electrode layer 17 and the second electrode layer 18 also to increase their thicknesses. In case of large holes 20, the material of the first and second electrically conductive members 21 and 22 may be not able to fully fill the holes 20. As a result, recesses may be generated in the conductive members 21 and 22. The first and second electrode layers 17 and 18 may be plated with tin to enhance solderability. Afterwards, the laminated structure is divided along the cutting lines to form a plurality of PTC devices 10. A single PTC device 10 is shown in FIG. 5. In an embodiment, the PTC device 10 has equal width and thickness, that is, as shown in FIG. 5, the first and second electrode layers 17 and 18 are square. As such, the PTC device 10 is not affected even if it rolls over. It should be noted that the first and second electrode layers 17 and 18 are not limited to square and may be rectangular.

Figure 6:
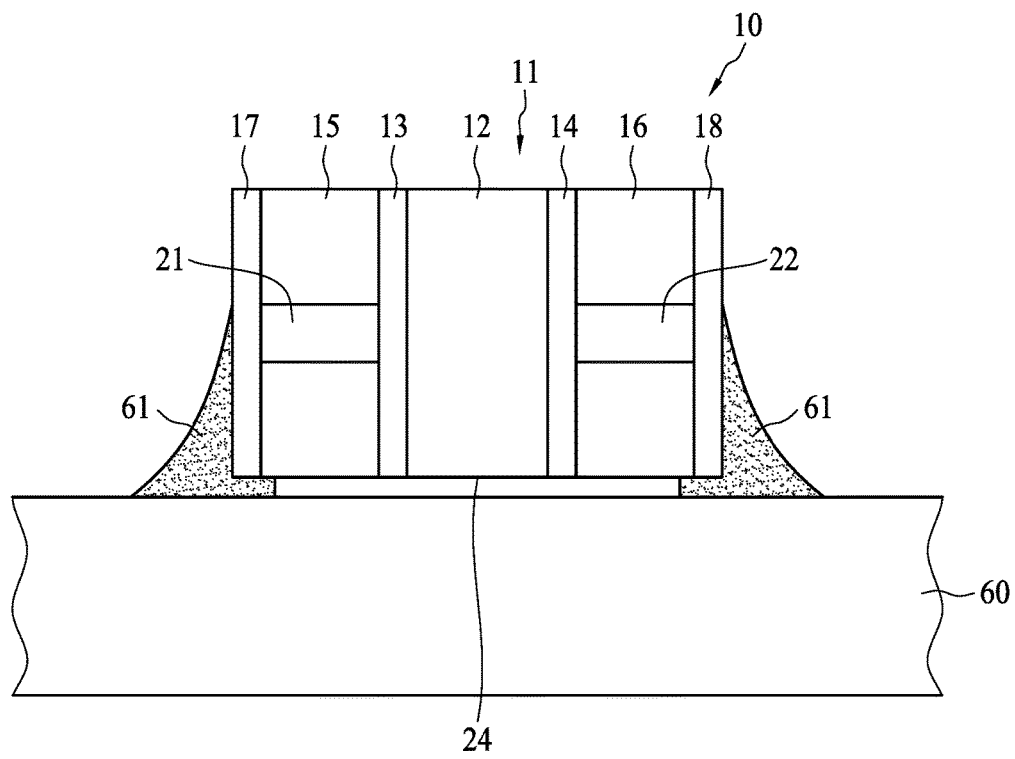
FIG. 6 shows a cross-sectional view of a PTC device applied to a circuit board in accordance with an embodiment of the present application.

FIG. 6 shows the PTC device 10 soldered onto a circuit board 60 in accordance with an embodiment of the present application. The PTC device 10 is soldered onto the circuit board 60 through solder paste 61. The PTC device 10 comprises a current and temperature sensing element 11, a first insulating layer 15, a second insulating layer 16, a first electrode layer 17, a second electrode layer 18, a first electrically conductive member 21 and a second electrically conductive member 22. The current and temperature sensing element 11 is a laminated structure comprising a first electrically conductive layer 13, a second electrically conductive layer 14 and a PTC material layer 12 laminated therebetween. The first electrode layer 17 is disposed on the first insulating layer 15, and electrically connects to the first electrically conductive layer 13. The second electrode layer 18 is disposed on the second insulating layer 16, and electrically connects to the second electrically conductive layer 14. The first electrically conductive member 21 penetrates through the first insulating layer 15 and connects to the first electrode layer 17 and the first electrically conductive layer 13. The second electrically conductive member 22 penetrates through the second insulating layer 16 and connects to the second electrode layer 18 and the second electrically conductive layer 14. In this embodiment, the first electrode layer 17, the first insulating layer 15, the first electrically conductive layer 13, the PTC material layer 12, the second electrically conductive layer 14, the second insulating layer 16 and the second electrode layer 18 are stacked in order and form a bottom surface 24. The bottom surface 24 faces the circuit board 60 as an interface for soldering onto the circuit board 60. During soldering, solder paste 61 is wicked up along the first electrode layer 17 and the second electrode layer 18. In other words, the first electrode layer 17 and the second electrode layer 18 serve as solder attach surfaces when soldering the PTC device 10 onto the circuit board 60.

Figure 7:
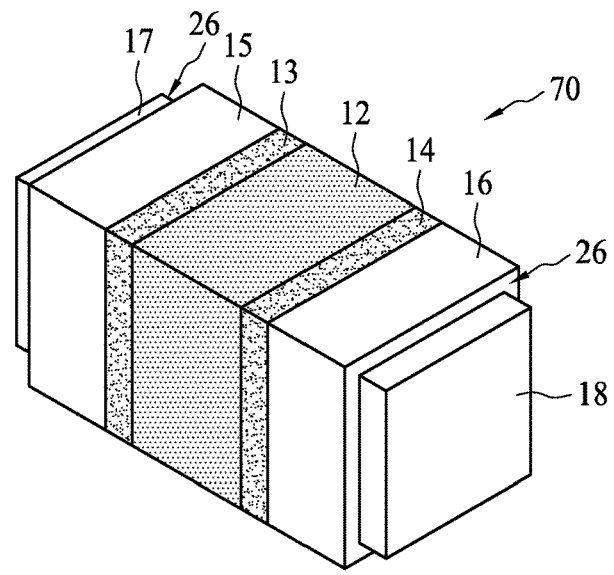
FIG. 7 shows a PTC device in accordance with another embodiment of the present application.
Figure 8:
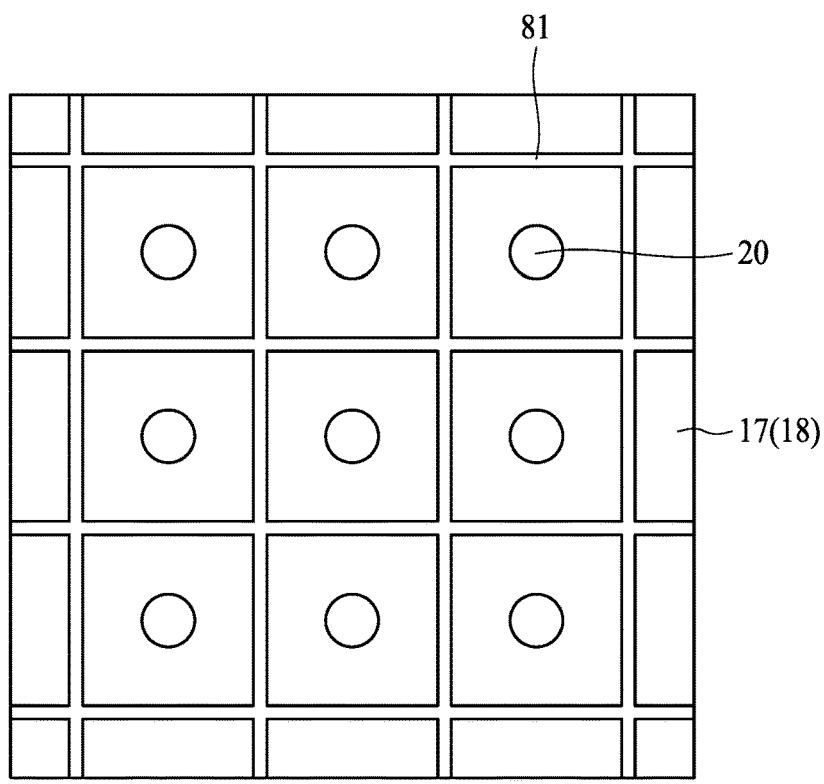
FIG. 8 shows a way of making a PTC device in accordance with another embodiment of the present application.

When cutting to form the PTC devices 10, as shown in FIG. 4, the bottom second electrode layer 18 may be stretched by the cutter to cause burrs because of metal ductility. FIG. 7 shows a PTC device 70 in accordance with another embodiment of the present application. In comparison with the PTC device 10 shown in FIG. 5, The first electrode layer 17 retracts at edges relative to the first insulating layer 15 to form notches 26, and the second electrode layer 18 retracts at edges relative to the second insulating layer 16 to form notches 26 as well. In this embodiment, the PTC device 70 is symmetrical. FIG. 8 shows a way of making the first and second electrode layers 17 and 18 of the PTC device 70. Before cutting, grooves 81 are made in the first and second electrode layers 17 and 18. The grooves 81 surround the holes 20 and locate at cutting positions. The width of the groove 81 is larger than cutting width and is approximately the width of a cutter plus twice the width of the notch 26. As a result, the cutter does not touch the first and second electrode layers 17 and 18 when cutting to form the notches 26, so as to avoid burrs on the electrode layer 17 or 18.

Figure 9:
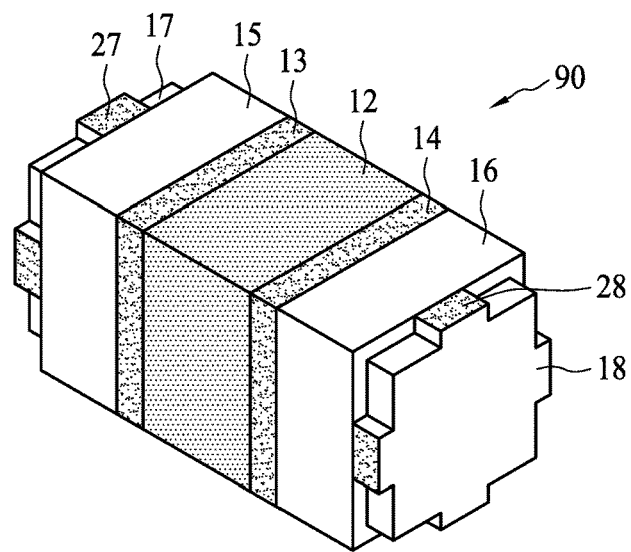
FIG. 9 shows a PTC device in accordance with yet another embodiment of the present application.
Figure 10:
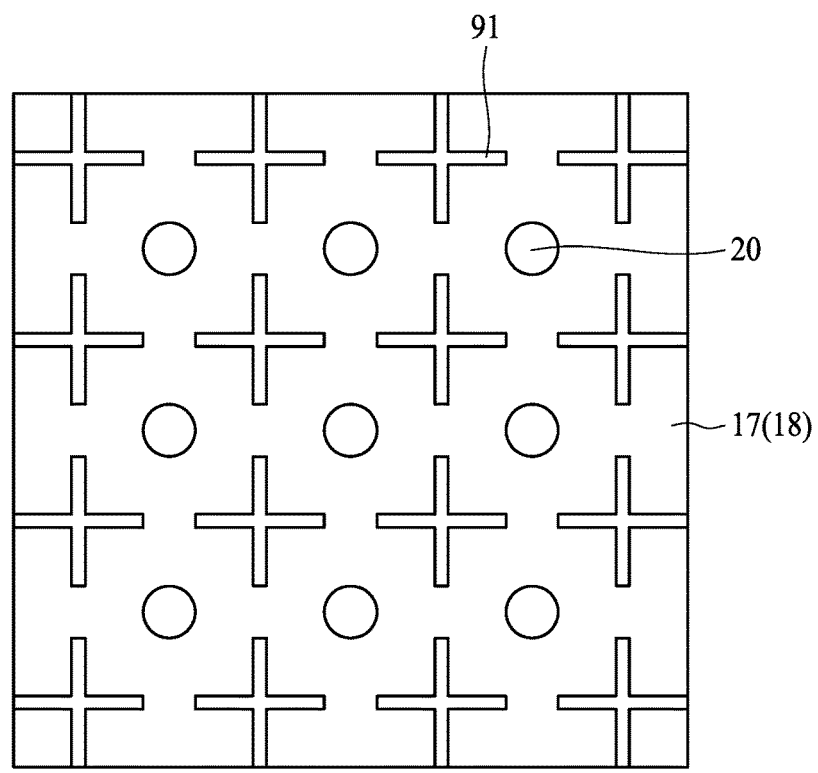
FIG. 10 shows a way of making a PTC device in accordance with yet another embodiment of the present application.

FIG. 9 shows a PTC device 90 in accordance with yet another embodiment of the present application. The first and second electrode layers 17 and 18 of both the PTC device 90 and the PTC device 70 retract their edges. Different from the PTC device 70, the edges of the first electrode layer 17 of the PTC device 90 comprise bulges 27 extending to the edges of the first insulating layer 15, the edges of the second electrode layer 18 of the PTC device 90 comprise bulges 28 extending to the edges of the second insulating layer 16. One of the bulges 27 and one of the bulges 28 reach the bottom of the PTC device 90 to provide paths for solder attachment or solder climbing. As such, it is advantageous to enhance solder attachment especially for large notches 26. FIG. 10 shows a way of making the first and second electrode layers 17 and 18 of the PTC device 90. Grooves 91 are made in the first and second electrode layers 17 and 18. The grooves 91 correspond to cutting positions but are not continuous. The first and second electrode layers 17 and 18 of neighboring devices 90 are partially connected. The connection of the first and second electrode layers 17 and 18 form the bulges 27 and 28. In an embodiment, the width of the bulge 27 or 28 is 20-60% of the width of the first or second insulating layer 15 or 16. The width of the groove 91 is larger than cutting width, and is approximately equal to the width of a cutter plus twice the width of the notch 26. Because the bulges 27 and 28 are relatively small in comparison with the first and second electrode layers 17 and 18, the burr issue can be diminished though the bulges 27 and 28 are cut. In addition, the solder attachment becomes more effective.

The electrically conductive member 21 or 22 may be located at but not limited to the center of the insulating layer 15 or 16. Alternatively, the electrically conductive members 21 and 22 may be located at lateral sides or corners of the insulating layer 15 and 16 as long as they can connect the first electrically conductive layer 13 and the first electrode layer 17 and connect the second electrically conductive layer 14 and the second electrode layer 18.

In addition to over-current protection applications, the PTC device of the present application can conduct temperature sensing. The PTC device is made of a laminated structure through pressing and cutting, a surface with laminated layers serves as a bottom surface for soldering. Not only are the simple structure and manufacturing process, but also it is suitable to be made for small devices such as form factors 0402 and 0201. In an embodiment, the PTC device has the same width and thickness to exclude the influence caused by rollover. The PTC device has the advantages: (1) Without internal circuit, the PTC device does not have material inflation and retraction problem and misalignment between internal circuit and external circuit. (2) With the prepreg supports, the PTC device of high structural strength has higher manufacturing yield. (3) The adjustment of the laminated structure thickness is more flexible if there is a need to increase voltage endurance. (4) Cutting grooves are associated with circuit design, so as to avoid burrs and enhance solder attachment. (5) Two sides of the PTC device are provided with two electrode layers, resistance measure can be conducted directly through the two electrode layers on the condition that it is unnecessary to identify front and back of the two electrode layers.

The above-described embodiments of the present invention are intended to be illustrative only. Numerous alternative embodiments may be devised by persons skilled in the art without departing from the scope of the following claims.

What is claimed is:
1. A PTC device, comprising:
a current and temperature sensing element being a laminated structure of a first electrically conductive layer, a second electrically conductive layer and a PTC material layer, the first electrically conductive layer being disposed on a first surface of the PTC material layer, the second electrically conductive layer being disposed on a second surface of the PTC material layer, the second surface being opposite to the first surface;
a first insulating layer disposed on the first electrically conductive layer;
a second insulating layer disposed on the second electrically conductive layer;
a first electrode layer disposed on the first insulating layer and electrically connecting to the first electrically conductive layer; and a second electrode layer disposed on the second insulating layer and electrically connecting to the second electrically conductive layer;

wherein the first and second electrode layers serve as solder attach surfaces for soldering the PTC device onto a circuit board, wherein the first insulating layer, the first electrically conductive layer, the PTC material layer, the second electrically conductive layer and the second insulating layer form a bottom surface facing the circuit board, the first electrode layer retracts at edges relative to the first insulating layer to form notches, and the second electrode layer retracts at edges relative to the second insulating layer to form notches.

2. The PTC device of claim 1, wherein the first electrode layer, the first insulating layer, the first electrically conductive layer, the PTC material layer, the second electrically conductive layer, the second insulating layer and the second electrode layer are laminated in order.

3. The PTC device of claim 1, wherein the first electrode layer, the first insulating layer, the first electrically conductive layer, the PTC material layer, the second electrically conductive layer, the second insulating layer and the second electrode layer form a bottom surface facing the circuit board as an interface for soldering onto the circuit board.

4. The PTC device of claim 1, further comprising:
a first electrically conductive hole penetrating through the first insulating layer and connecting to the first electrode layer and the first electrically conductive layer; and
a second electrically conductive hole penetrating through the second insulating layer and connecting to the second electrode layer and the second electrically conductive layer.

5. The PTC device of claim 4, wherein the first electrically conductive hole is located at a center, lateral side or corner of the first insulating layer, and the second electrically conductive hole is located at a center, lateral side or corner of the second insulating layer.

6. The PTC device of claim 1, wherein the first electrode layer comprises a bulge extending to an edge of the first insulating layer, and the second electrode layer comprises another bulge extending to an edge of the second insulating layer.

* * * * *